United States Patent [19]

Holzer

[11] Patent Number: 5,656,960

[45] Date of Patent: Aug. 12, 1997

[54] CONTROLLED SLOPE OUTPUT BUFFER

[75] Inventor: Reuven Holzer, Herzlia, Israel

[73] Assignee: National Semiconductor Corporation, Santa Clara, Calif.

[21] Appl. No.: 449,477

[22] Filed: May 30, 1995

[51] Int. Cl.$^6$ ................................................ H03K 5/12
[52] U.S. Cl. ............................................ 327/170; 327/108
[58] Field of Search ............................. 323/315; 326/82, 326/83; 327/108–111, 170, 538, 543

[56] References Cited

U.S. PATENT DOCUMENTS

| | | | |
|---|---|---|---|
| 5,111,064 | 5/1992 | Ward | 307/270 |
| 5,319,252 | 6/1994 | Pierce et al. | 307/263 |
| 5,432,471 | 7/1995 | Maiumdar et al. | 327/403 |
| 5,451,861 | 9/1995 | Giebel | 323/315 |

OTHER PUBLICATIONS

R. Senthinathan and J.L. Pierce, "Application Specific CMOS Output Driver Circuit Design Techniques to Reduce Simultaneous Switching Noise", IEEE Journal of Solid–State Circuits, vol. 28, No. 12, Dec. 1993, pp. 1383–1388.

Primary Examiner—Timothy P. Callahan
Assistant Examiner—Jeffrey Zweizig
Attorney, Agent, or Firm—Skjerven, Morrill, MacPherson, Franklin & Friel

[57] ABSTRACT

A controlled-slope output buffer is furnished to reduce electro-magnetic interference (EMI) and ground bounce noise which commonly arises in output buffers in a VLSI chip. In the controlled-slope buffer, output current pulses are shaped to reduce higher frequency signal components. Corrective shaping of the electrical signals by the controlled-slope buffer is effective in reducing EMI emissions in a frequency range from 200 to 1000 MHz. Output signals of the controlled-slope output buffer have voltage slopes which are substantially the same as output signals generated by conventional output buffers. However, the controlled-slope output buffer generates output signals in which the shape of the current pulse is greatly improved for reducing EMI and ground bounce noise. In the controlled-slope buffers according to the present invention, current pulses have a triangular shape when they are drawn in the time domain. This shape of current pulse results in the lowest achievable time derivative for a given capacitive load. Current pulses having this shape also reduce ground bounce levels in an integrated circuit chip.

21 Claims, 7 Drawing Sheets

5,656,960

CONTROLLED SLOPE OUTPUT BUFFER

FIELD OF THE INVENTION

This invention relates to output buffers for integrated circuit devices. More specifically, this invention relates to an output buffer which reduces EMI and ground bounce noise by controlling the slope of the output current pulse.

BACKGROUND OF THE INVENTION

As the size of CMOS devices is reduced into the submicron region, the operating frequency of an output driver increases to frequencies of 60 Mhz and higher, reducing rise/fall times and the pulse width of output signals. For a device utilizing a 5 volt supply, an output driver operating frequency of 60 MHz corresponds to an output transient time less than 0.4 V/ns for a given load capacitance (i.e. $T_r = T_f < 7$ ns for $C_{Load} = 25$ pF). An increase in switching speed of an output buffer increases the rate of change of switching current which, in combination with chip-package interface power distribution parasitics, creates ground bounce and electromagnetic interference (EMI) noise when output drivers switch simultaneously. It is essential that an output driver limit ground bounce and EMI noise to within a maximum allowable noise level. Otherwise unreliable operation, such as false triggering, double clocking, missing clock pulses and the like, occurs in logic devices that are connected to the same supply and ground reference lines. Various governmental regulations, for example FCC regulations, set a standard maximum electromagnetic interference (EMI) level. Devices and systems emitting too large an EMI level fail these standards and cannot be sold.

Various output driver design methodologies have been practiced in application-specific integrated circuits (ASICs) to attempt to solve the problems of EMI emissions and ground bounce. These methodologies are implemented, for example, in a current-controlled output driver, a controlled-slew rate output driver and a slow ramp high drive output driver.

FIG. 1, labelled PRIOR ART, illustrates a conventional CMOS output driver 100 in which the gate input terminals of a final stage p-channel transistor 102 and a final stage n-channel transistor 104 are tied together so that through current $I_T$, the component of output driver current flowing directly from supply to ground, is not minimized. Through current $I_T$ does not contribute to charging or discharging of the load capacitance $C_{LOAD}$, but rather simply contributes to the switching noise of the output driver. The current pulse in this buffer has a very sharp rise time. The current during switching rises from zero to a maximum current in less than 2 ns.

FIG. 2, labelled PRIOR ART, illustrates a known current-controlled output driver 200 which reduces noise by controlling the maximum switching current $I_{max}$ of the switching output signal. However, controlling the maximum switching current also disadvantageously limits the switching speed of the output driver. The switching speed of a fully current-controlled output driver is always less than or equal to the switching speed of an equivalent current unregulated output driver. Another disadvantage of the current-controlled output driver 200 is that both the "push" and complementary "pull" portions of the final stage of the output driver 200 include two drive transistors so that a larger circuit area is required for the driver. Furthermore, the current pulse generated by the current-controlled output driver 200 does not optimally avoid EMI emissions and ground bounce.

FIG. 3, labelled PRIOR ART, illustrates a known controlled slew rate output driver 300 which reduces noise by controlling switching output signal rise and fall times. The current pulse generated by the controlled slew rate output driver 300 does not optimally avoid EMI emissions and ground bounce.

FIG. 4, labelled PRIOR ART, depicts a known slow ramp high drive output driver 400 as described in U.S. Pat. No. 5,111,064, "Slow Ramp High Drive Output Pad" to James Ward, issued May 5, 1992. A CMOS drive circuit in an integrated circuit bonding pad is controlled by a pre-driver signal to change the potential on the output pad in accordance with these signals. Undesirable interference (EMI) problems are eliminated or significantly reduced by slowing the ramp of change of the signal appearing on the output bonding pad when it changes from a high or positive binary state to a lower, relatively negative binary state. This is affected by splitting the output NMOS transistor of the CMOS output driver into two parallel connected, relatively small-sized transistors. Each of these transistors is driven from the signal input terminal through a relatively low current source which causes the gate capacitance to be slowly charged. Circuit 400 disadvantageously slows the output signal. Furthermore, the current pulse generated by the slow ramp high drive output circuit 400 does not optimally avoid EMI emissions and ground bounce.

SUMMARY OF THE INVENTION

In accordance with the present invention, a controlled-slope output buffer is furnished to reduce electro-magnetic interference (EMI) and ground bounce noise which commonly arises in output buffers in a VLSI chip. In the controlled-slope buffer, output current pulses are shaped to reduce higher frequency signal components for an output buffer designed to have a slope of less than 5 ns at its output when the buffer is loaded with a capacitive load of 50 pF. Corrective shaping of the electrical signals by the controlled-slope buffer is effective in reducing EMI emissions in a frequency range from 200 to 1000 MHz. Output signals of the controlled-slope output buffer have voltage slopes which are substantially the same as output signals generated by conventional output buffers. However, the controlled-slope output buffer generates output signals in which the shape of the current pulse is greatly improved for reducing EMI and ground bounce noise. In the controlled-slope buffers according to the present invention, current pulses have a triangular shape when they are drawn in the time domain. This shape of current pulse results in the lowest achievable time derivative for a given capacitive load. Current pulses having this shape also reduce ground bounce levels in an integrated circuit chip.

In accordance with one embodiment of the present invention, an output buffer includes a slow discharging inverter having an input terminal connected to a voltage input line and an output terminal, an n-channel output circuit and a p-channel output circuit. The n-channel output circuit includes a p-channel drive transistor having a gate terminal connected to the slow discharging inverter output terminal, a source terminal connected to a voltage supply and a drain terminal, and an n-channel current mirror having a drain terminal connected to the p-channel drive transistor drain terminal, a voltage source connected to a voltage reference and an output terminal connected to a load. The p-channel output circuit includes an n-channel drive transistor having a gate terminal connected to the slow discharging inverter output terminal, a source terminal connected to a voltage reference and a drain terminal, and a p-channel current mirror having a drain terminal connected to the n-channel drive transistor drain terminal, a source terminal connected to a voltage supply and an output terminal connected to the load.

In accordance with another embodiment of the present invention, a method of operating an output buffer including the steps of sensing an input voltage which is changing from a first logic level to a second logic level, and inverting the sensed input voltage slowly from the second logic level to the first logic level. During a first period of the slow inverting of the sensed input voltage from the second logic level to the first logic level, a first current in a first current path is held unchanged until the first period is terminated by the inverted voltage reaching a threshold voltage. During a second period of the slow inverting of the sensed input voltage from the second logic level to the first logic level, the first current is conducted and mirrored to a second current path. The second current in the second current path discharges a load capacitor holding an output voltage until the second period is terminated by the output voltage reaching a cutoff voltage. During a third period of the slow inverting of the sensed input voltage from the second logic level to the first logic level, the first current is cut off and a reducing second current is conducted.

The controlled-slope output buffer described above has several advantages. One advantage is that the output buffer substantially minimizes ground bounce noise for a particular voltage slope at the output signal terminal. Another advantage is that the output buffer greatly reduces EMI emissions. Furthermore, the output buffer advantageously generates a current pulse at the output signal terminal that has a symmetrical triangular shape. A current pulse with a symmetrical triangular shape substantially minimizes current slope for a particular charge Q at the time of signal transition.

This invention will be more fully understood in light of the following detailed description taken together with the drawings.

DETAILED DESCRIPTION OF THE PREFERRED EMBODIMENT

Figure 1:
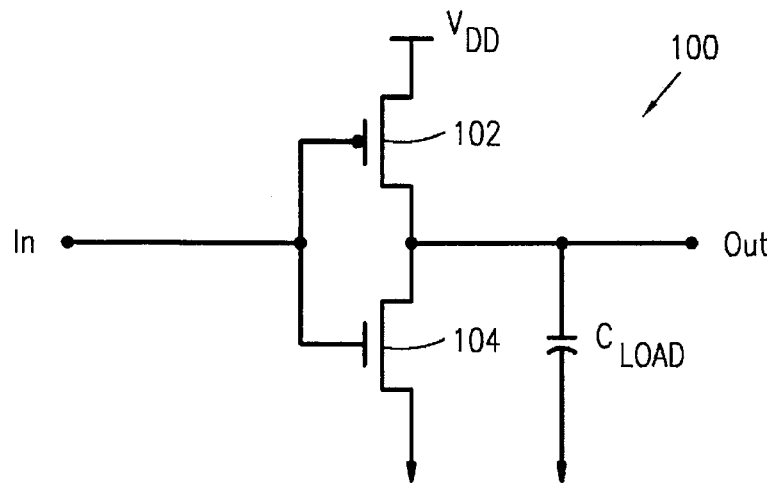
FIG. 1, labelled PRIOR ART, illustrates a conventional CMOS output driver.
Figure 2:
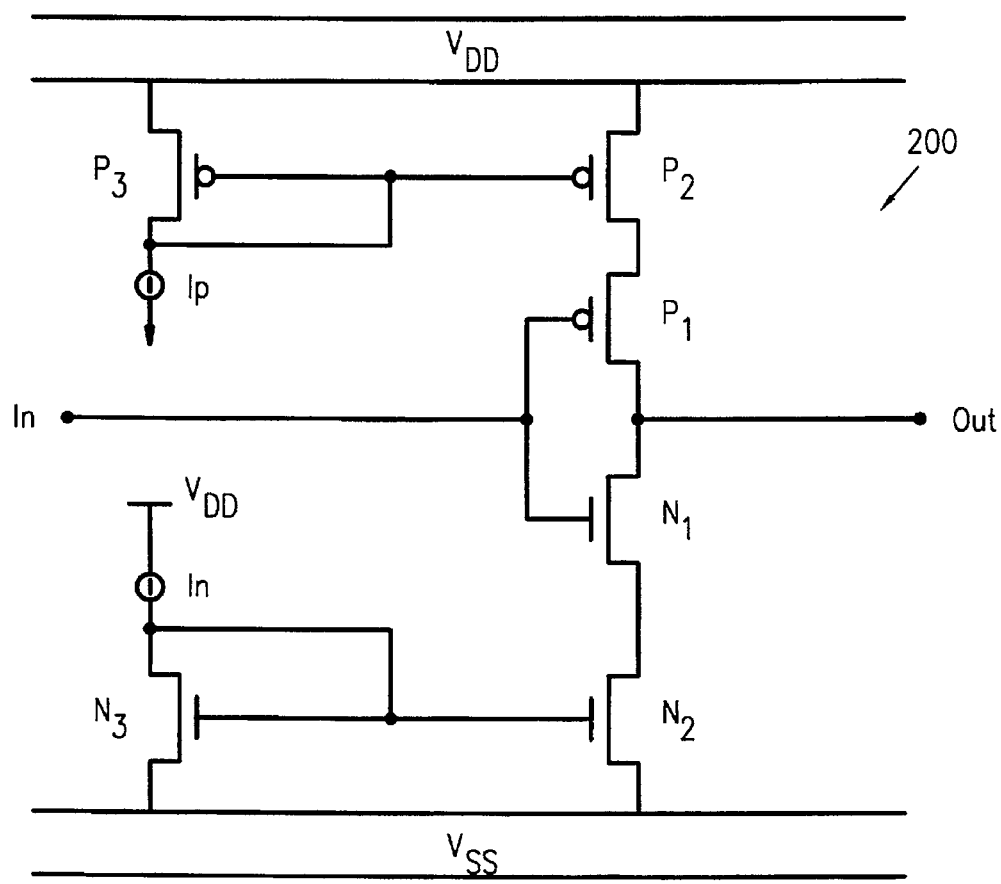
FIG. 2, labelled PRIOR ART, illustrates a known current-controlled output driver which reduces noise by controlling the maximum switching current $I_{max}$ of the switching output signal.
Figure 3:
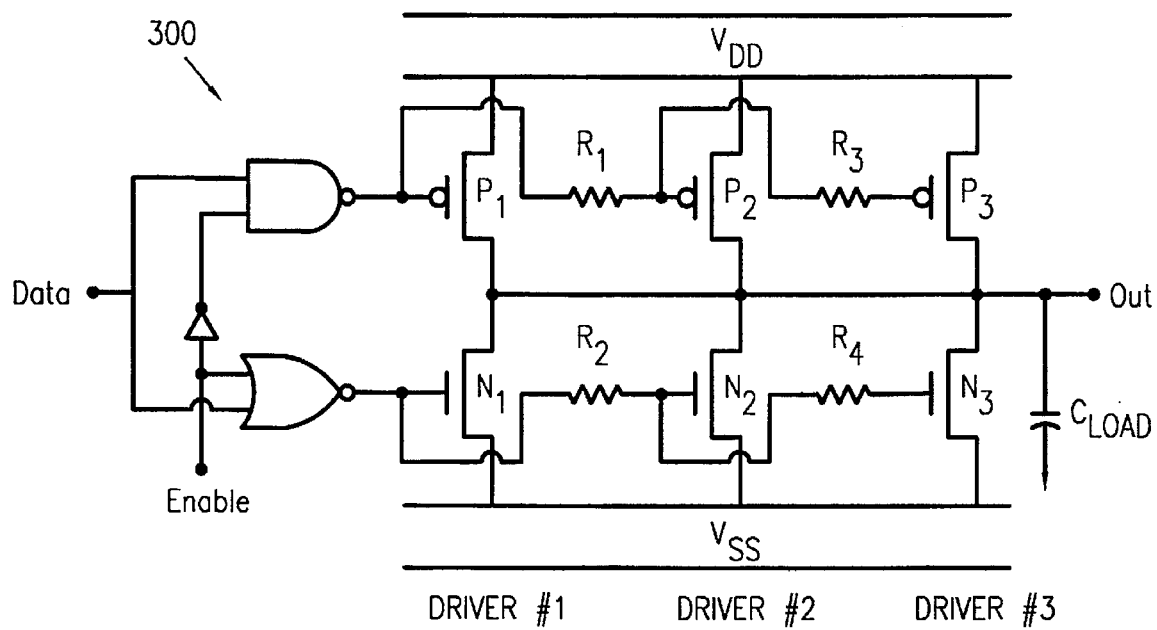
FIG. 3, labelled PRIOR ART, illustrates a known controlled slew rate output driver which reduces noise by controlling switching output signal rise and fall times.
Figure 4:
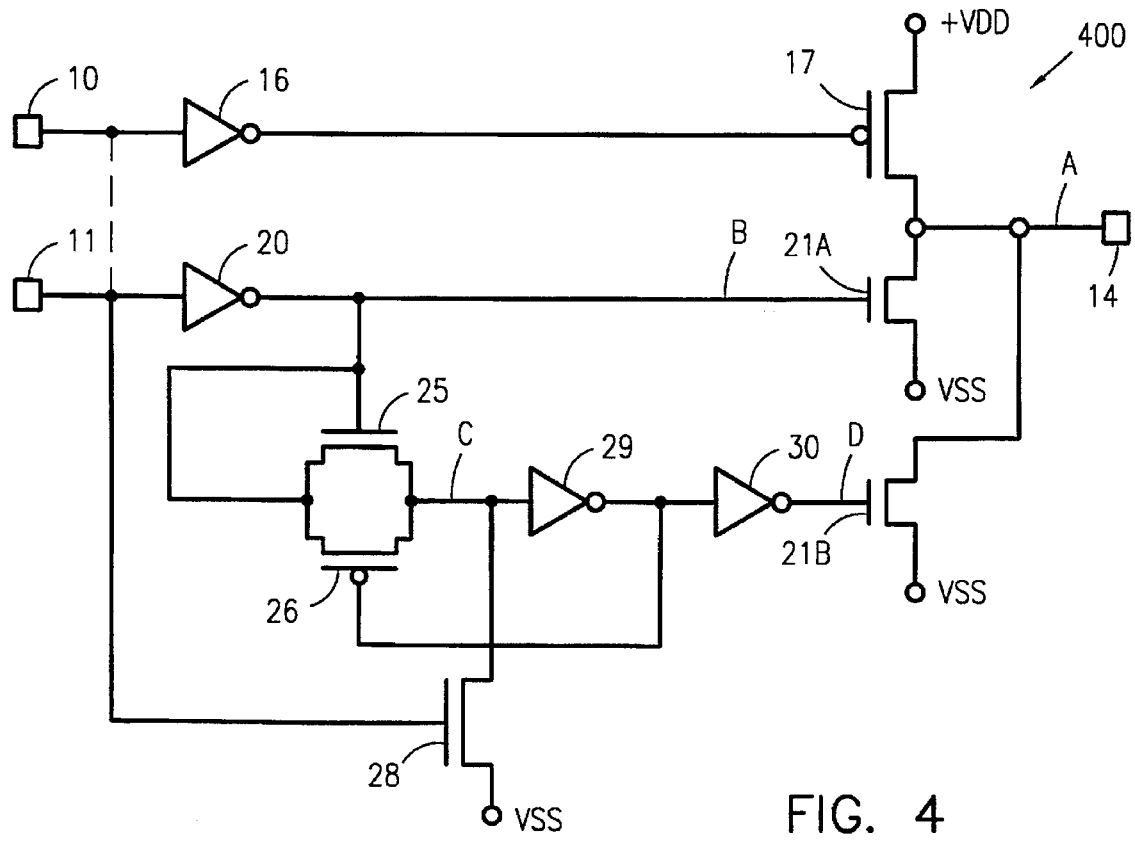
FIG. 4, labelled PRIOR ART, depicts a known slow ramp high drive output driver.
Figure 5:
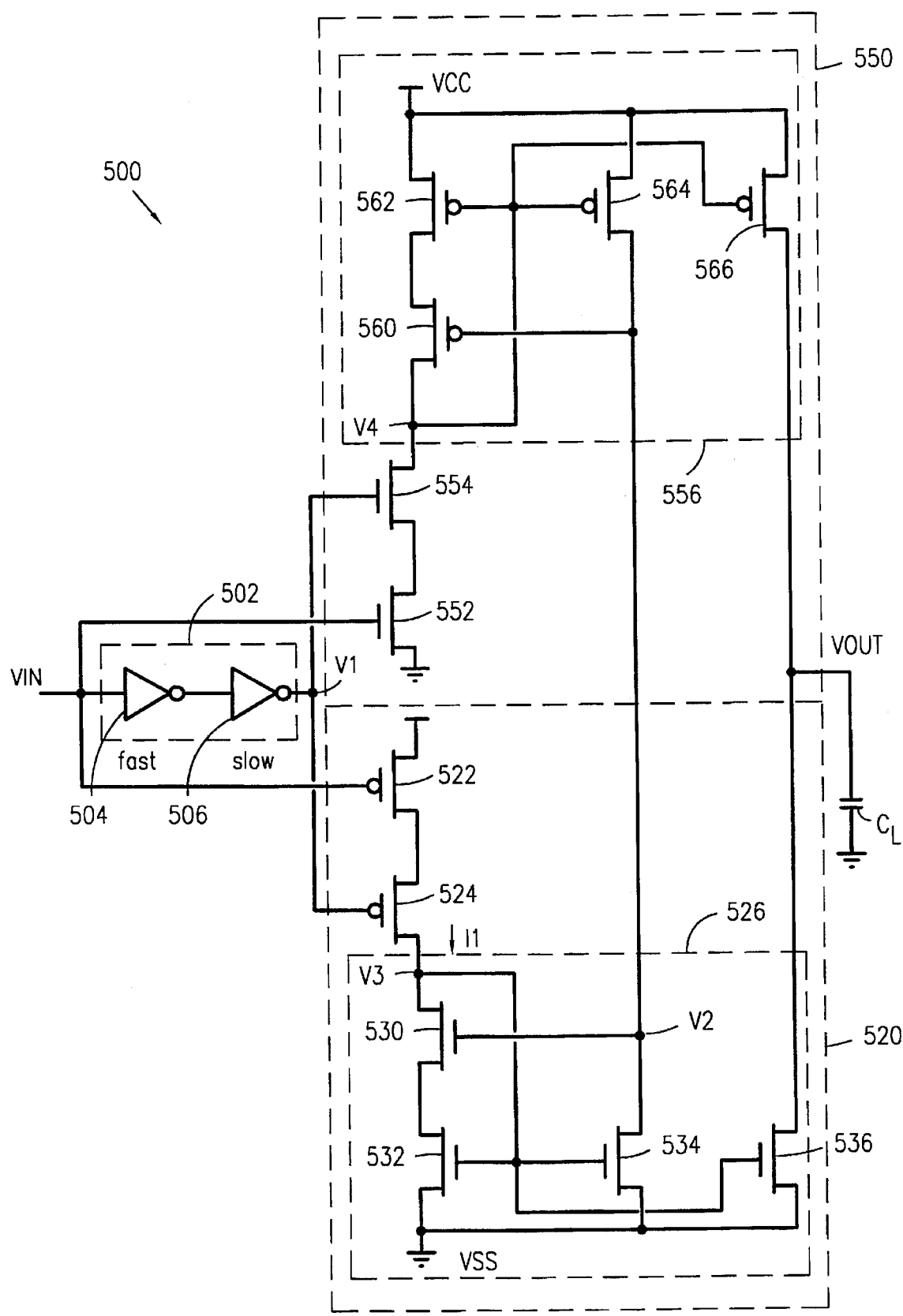
FIG. 5 is a schematic circuit diagram illustrating a controlled-slope CMOS level output buffer in accordance with one embodiment of the present invention.

Referring to FIG. 5, a controlled-slope CMOS level output buffer 500 receives an input voltage signal on an input voltage line VIN and generates an output voltage signal on an output signal line VOUT. The output signal line VOUT is connected to a load capacitor $C_L$. The CMOS level output buffer 500 includes a delay circuit 502 and two mutually-symmetric circuits, an n-channel output circuit 520 and a p-channel output circuit 550. The delay circuit 502 includes two inverters connected in series, a fast-discharging inverter 504 and a slowly-discharging inverter 506. The slowly-discharging inverter 506 generates a slowly changing voltage at a node V1. The slowly changing voltage at node V1 initiates various transient electrical signals in the n-channel and p-channel output circuits 520 and 550, resulting in waveform shaping of the output current and voltage signals.

The n-channel output circuit 520 includes a first p-channel drive transistor 522, a second p-channel drive transistor 524 and an n-channel current mirror 526. In this embodiment, first p-channel drive transistor 522 is used to realize a resistor. This is possible because p-channel drive transistor 522 functions in a substantially linear mode of operation while the transistor is conductive. In other circuit embodiments, a resistor may be alternatively used, although the resistor function is more advantageously implemented using a transistor in an integrated circuit application. The first p-channel drive transistor 522 and the second p-channel drive transistor 524 are controlled by the input voltage signal. The first p-channel drive transistor 522 is connected directly to the input voltage line VIN. The second p-channel drive transistor 524 is connected to the input voltage line VIN through the delay circuit 502 at the node V1. Accordingly, the two p-channel drive transistors 522 and 524 supply current drive. First p-channel drive transistor 522 serves as a resistor on which the voltage and current rise linearly.

The n-channel current mirror 526 further includes four transistors, specifically, a first, second, third and fourth current mirror n-channel transistors 530, 532, 534 and 536. The first and second current mirror n-channel transistors 530 and 532 are connected in series with the two p-channel drive transistors 522 and 524 so that the source to drain pathway between a supply voltage source on a supply terminal VCC and a ground reference voltage on a reference terminal VSS. Second p-channel drive transistor 524 controls a current path I1 conducting in this source to drain pathway through p-channel transistors 522 and 524 and n-channel transistors 530 and 532. A node V3 is formed at the connection between the second p-channel transistor 524 and the first current mirror n-channel transistor 530.

Third current mirror n-channel transistor 534 has a source to drain pathway connected between the reference terminal VSS and a node V2 at the gate of first current mirror n-channel transistor 530. Third current mirror n-channel transistor 534 has a gate connected to the gates of second current mirror n-channel transistor 532 and fourth current mirror n-channel transistor 536 at node V3. Third current mirror n-channel transistor 534 mirrors the current in path I1 through transistor 534. The mirrored current through third current mirror n-channel transistor 534 is fed back to control the current flowing in the current path I1 by the connection of node V2 to the gate of first current mirror n-channel transistor 530.

Fourth current mirror n-channel transistor 536 has a source to drain pathway connected between the output signal line VOUT and the reference terminal VSS and a gate connected to the node V3. Fourth current mirror n-channel transistor 536 controls discharging of a load capacitor $C_L$ in response to variations in voltage at node V3 which result from current flowing in current path I1.

The p-channel output circuit 550 is symmetric to n-channel output circuit 520 and functions in the same manner. The p-channel output circuit 550 includes a first n-channel drive transistor 552, a second n-channel drive transistor 554 and a p-channel current mirror 556. The first n-channel drive transistor 552 and the second n-channel drive transistor 554 are controlled by the input voltage signal. The first n-channel drive transistor 552 is connected directly to the input voltage line VIN. The second n-channel drive transistor 554 is connected to the input voltage line VIN through the delay circuit 502 at the node V1.

The p-channel current mirror 556 further includes four transistors, specifically, a first, second, third and fourth current mirror p-channel transistors 560, 562, 564 and 566. The first and second current mirror p-channel transistors 560 and 562 are connected in series with the two n-channel drive transistors 552 and 554 so that the source to drain pathway between a supply voltage source on a supply terminal VCC and a ground reference voltage on a reference terminal VSS includes n-channel transistors 552 and 554 and p-channel transistors 560 and 562. A node V4 is formed at the connection between the second n-channel transistor 554 and the first current mirror p-channel transistor 560. Third current mirror p-channel transistor 564 has a source to drain pathway connected between the node V2 at the gate of first current mirror and the supply terminal VCC and a gate connected to the gates of second and fourth current mirror p-channel transistors 562 and 566 at node V4. Fourth current mirror p-channel transistor 566 has a source to drain pathway connected between the output signal line VOUT and the reference terminal VSS and a gate connected to the node V4.

In accordance with this structure, when the output signal on line VOUT is a high level state, the load is driven by fourth current mirror p-channel transistor 566. When the output signal on line VOUT is a low level state, the output current from the load is sunk by fourth current mirror n-channel transistor 536.

Figure 6:
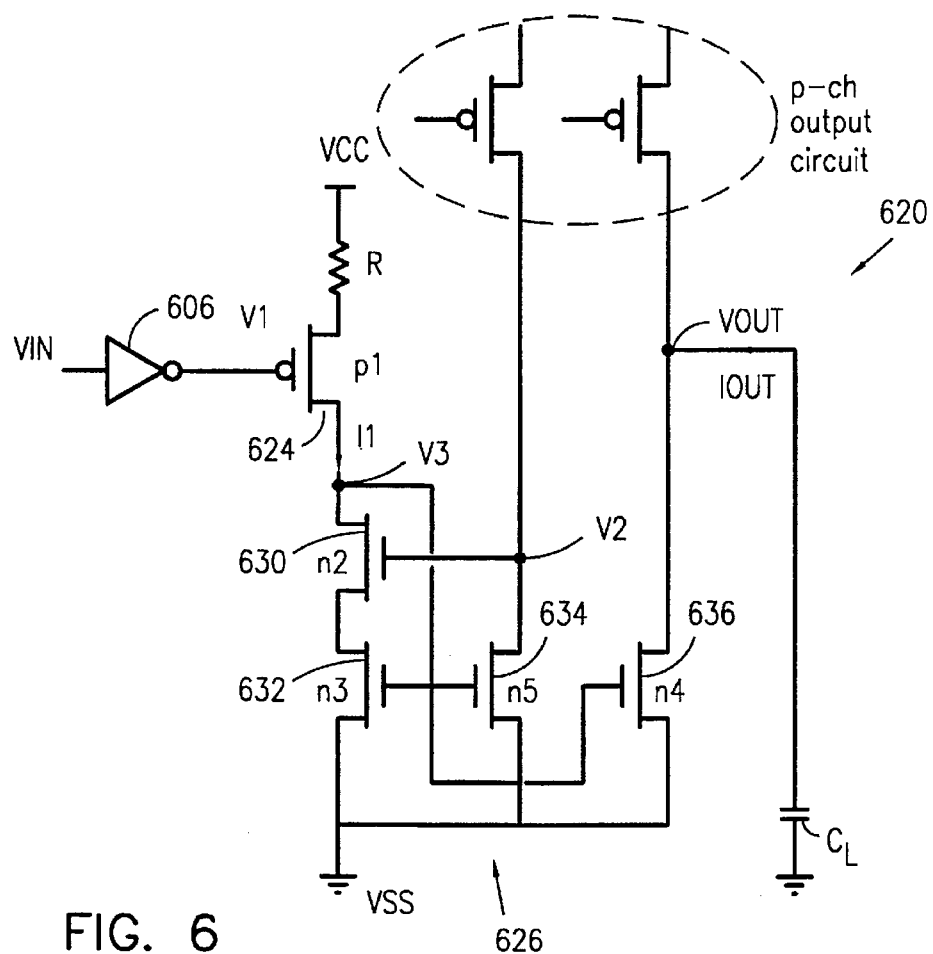
FIG. 6 is a schematic circuit diagram showing an n-channel output circuit in a controlled-slope output buffer such as the buffer illustrated in FIG. 5.
Figure 7:
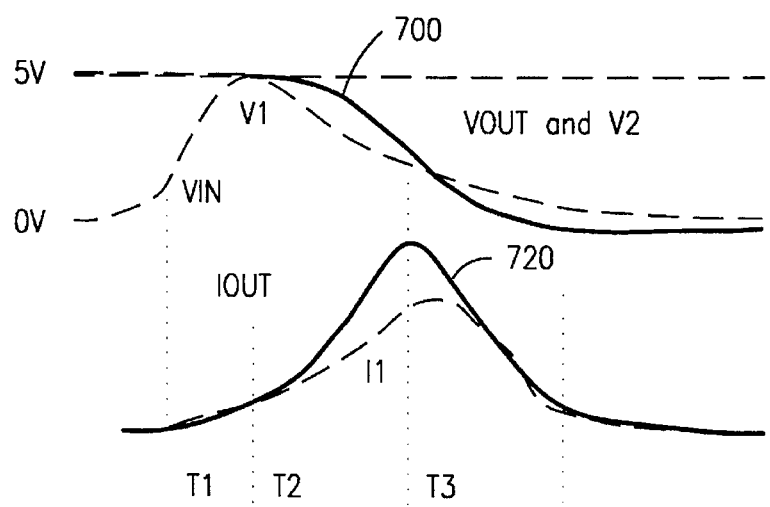
FIG. 7 is a timing diagram showing timed operations of the output circuit depicted in FIG. 6.

Referring to a circuit diagram of an n-channel output circuit 620 shown in FIG. 6 in conjunction with a voltage time waveform 700 and a current time waveform 720 shown in FIG. 7, timed operations of the output buffer are discussed. In accordance with the present invention, a controlled-slope output buffer produces a triangular-shaped current pulse, shown in the current time waveform 720. The triangular-shaped current pulse substantially reduces the time-derivative of the current pulse for a given capacitive load and voltage slope. In contrast, a conventional output buffer generates a current pulse shape which includes a large slope at the trailing edge of the pulse. The large-sloped trailing edge causes a noisy signal, in the form of both higher EMI emissions and higher ground bounce, in an integrated circuit.

Referring to FIG. 6, n-channel output circuit 620 includes a resistor R, a p-channel drive transistor 624, and an n-channel current mirror 626. The n-channel current mirror 626, which is substantially the same as n-channel current mirror 526 shown in FIG. 5, includes first, second, third and fourth current mirror n-channel transistors 630, 632, 634 and 636. A slowly-discharging inverter 606, in response to an input voltage signal on an input voltage line VIN, generates a voltage signal at a node V1 which is applied to the gate terminal of p-channel drive transistor 624. The voltage signal at node V1 controls the current in a current pathway I1 conducting through the p-channel drive transistor 624 and the first and second current mirror n-channel transistors 630 and 632. A node V3 is formed at the connection between the p-channel transistor 624 and the first current mirror n-channel transistor 630. Third and fourth current mirror n-channel transistors 634 and 636 are also included in the n-channel current mirror 626. Third current mirror n-channel transistor 634 has a source to drain pathway connected between the reference terminal VSS and a node V2 at the gate of first current mirror n-channel transistor 630.

The n-channel output circuit 620 generates an electrical signal at the output signal line VOUT as a combination of various transient effects within the circuit 620. The voltage time waveform 700 and current time waveform 720 generated by the n-channel output circuit 620 are formed according to these transient effects, which generally are manifest in three time periods T1, T2 and T3 of an overall electrical signal pulse.

In a first time period T1, an input voltage signal on an input voltage line VIN changes from a "low" logical state to a "high" logical state, causing the slowly-discharging inverter 606 to begin to discharge the voltage at node V1 slowly from a high logical state to a low logical state. During the first time period T1, p-channel drive transistor 624 is in cutoff so that an output current and an output voltage at the output signal line VOUT do not change. The voltage at node V1 continues to discharge until the voltage becomes less than the threshold gate voltage $VT_p$ of the p-channel drive transistor 624, at which time the p-channel drive transistor 624 begins to conduct current. The second time period T2 begins when the p-channel drive transistor 624 becomes conductive. The slowly-discharging inverter 606 discharges the voltage at node V1 linearly with respect to time. As the voltage at node V1 falls linearly during time period T2, the current conducting in the current pathway I1 rises in a linear manner in accordance with the following equation:

$$I1 = \frac{VCC - VT_p - V1}{R}.$$

During time period T2, first current mirror n-channel transistor 630 is conductive and second, third and fourth current mirror n-channel transistors 632, 634 and 636 function as a current mirror. The current conducting in current pathway I1 causes the voltage at node V3 to rise and, via the connection of node V3 to the gate of fourth current mirror n-channel transistor 636, causes the fourth current mirror n-channel transistor 636 to become conductive. Conduction of current in fourth current mirror n-channel transistor 636 causes the output current on output signal line VOUT to discharge the load capacitor $C_L$ and, thus, the output voltage on output signal line VOUT to fall. Sizing (W/L ratioing) of the third and fourth current mirror n-channel transistors 634 and 636 is selected so that third current mirror n-channel transistor 634 discharges the voltage at node V2 as the same rate as the output voltage on the output signal line VOUT is discharged, when the output signal line VOUT is fully loaded. With third and fourth current mirror n-channel transistors 634 and 636 sized in this manner, the output current on line IOUT is limited when the output load is smaller and the output voltage on the output signal line VOUT changes faster than the voltage at node V2. The voltage at node V2 gradually falls during time period T2 until the voltage, which is applied to the gate of first current mirror n-channel transistor 630, reaches the cutoff voltage $V_c$ of transistor 630, cutting off current in current path I1. This event terminates time period T2 and begins time period T3. At the end of time period T2, the voltage at node V3 is charged to the supply voltage at supply terminal VCC.

During time period T3, the current mirror formed by first, second, third, fourth and fifth current mirror p-channel transistors 560, 560, 562, 564 and 566, respectively, no longer functions as a current mirror. The voltage at node V3 charges more rapidly and reaches the supply voltage at the supply terminal VCC. The current conducting through fourth current mirror n-channel transistor 636, which discharges the load capacitor $C_L$, is gradually turned off due to a decrease in drain-load source voltage which is equal to the voltage on the output signal line VOUT.

Figure 8:
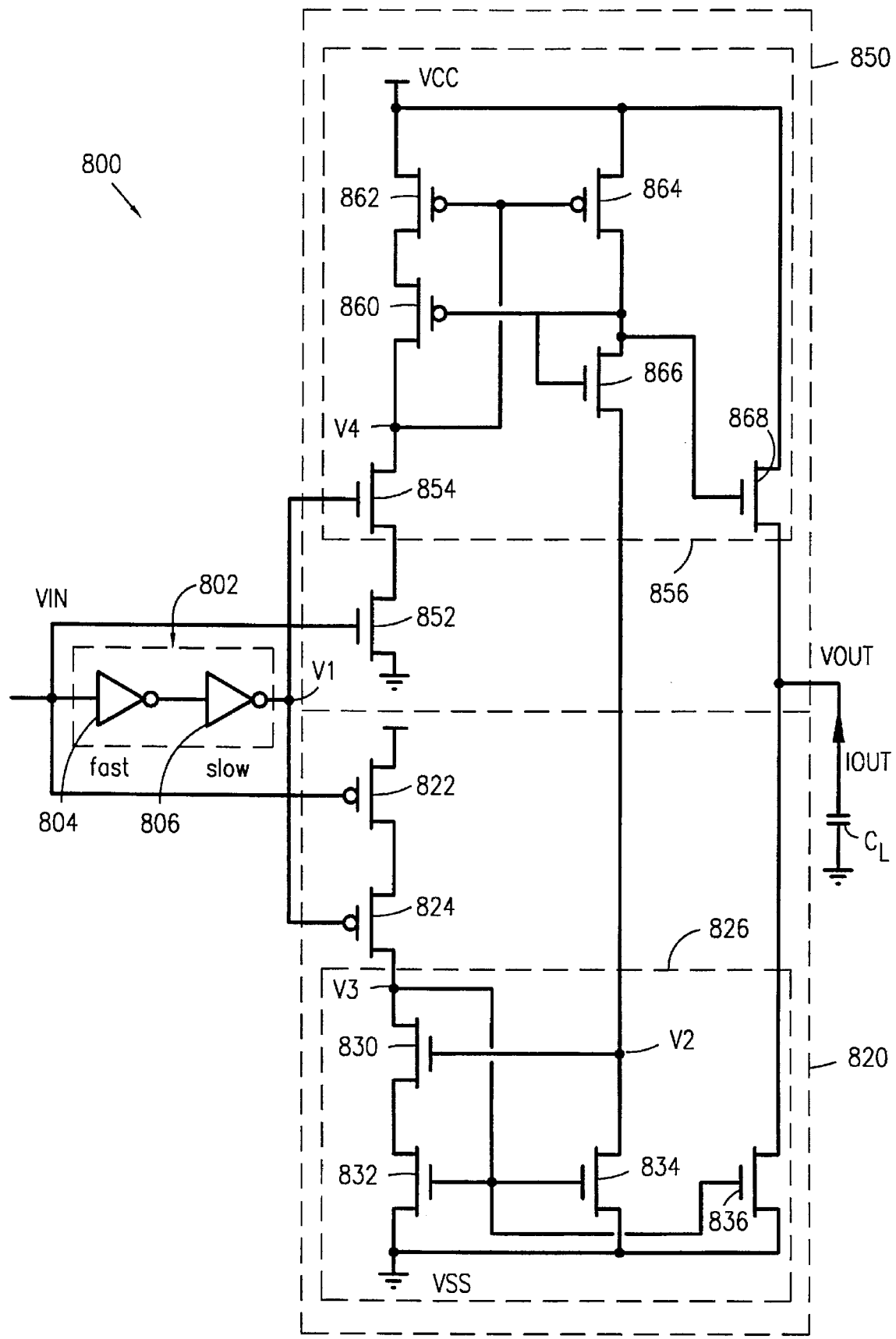
FIG. 8 is a schematic circuit diagram illustrating a controlled-slope TTL level output buffer in accordance with an embodiment of the present invention.

Referring to FIG. 8, a controlled-slope TTL level output buffer 800 is similar to the controlled-slope CMOS level output buffer 500 shown in FIG. 5, including a delay circuit 802 and an n-channel output circuit 820 which are substantially identical to the delay circuit 502 and the n-channel output circuit 520. However, the TTL level output buffer 800 includes a TTL level output circuit 850 which differs from p-channel output circuit 550.

The TTL level output circuit 850 includes a first n-channel drive transistor 852, a second n-channel drive transistor 854 and a TTL level current mirror 856. The first n-channel drive transistor 852 and the second n-channel drive transistor 854 are controlled by the input voltage signal. The first n-channel drive transistor 852 is connected directly to the input voltage line VIN. The second n-channel drive transistor 854 is connected to the input voltage line VIN through the delay circuit 802 at the node V1.

The TTL level current mirror 856 further includes five transistors, specifically, a first, second and third TTL current mirror p-channel transistors 860, 862 and 864 and a first and second TTL current mirror n-channel transistors 866 and 868. The first and second TTL current mirror p-channel transistors 860 and 862 are connected in series with the two n-channel drive transistors 852 and 854 so that the source to drain pathway between a supply voltage source on a supply terminal VCC and a ground reference voltage on a reference terminal VSS includes n-channel transistors 852 and 854 and p-channel transistors 860 and 862. A node V4 is formed at the connection between the second n-channel transistor 854 and the first current mirror p-channel transistor 860. Third TTL current mirror p-channel transistor 864 is connected in series with first TTL current mirror n-channel transistor 866. Third TTL current mirror p-channel transistor 864 has a source terminal connected to the supply terminal VCC, a gate terminal connected to the gate terminal of the second TTL current mirror p-channel transistor 862 and a drain terminal. First TTL current mirror n-channel transistor 866 has a source terminal connected to the node V2 and a gate terminal and drain terminal which are mutually interconnected and connected to the gate terminal of the first TTL current mirror p-channel transistor 860. Second TTL current mirror n-channel transistor 868 has a source terminal connected to the output signal line VOUT, a drain terminal connected to the supply terminal VCC and a gate terminal connected to the gate terminal of first TTL current mirror p-channel transistor 860.

Controlled-slope TTL level output buffer 800 differs operationally from controlled-slope CMOS level output buffer 500. For CMOS level output buffer 500 when the output signal on line VOUT is a high level state, the load is driven by a p-channel transistor—fourth current mirror p-channel transistor 566. For TTL level output buffer 800 when the output signal on line VOUT is a high level state, the load is driven by an n-channel transistor—second current mirror n-channel transistor 868.

Figure 9:
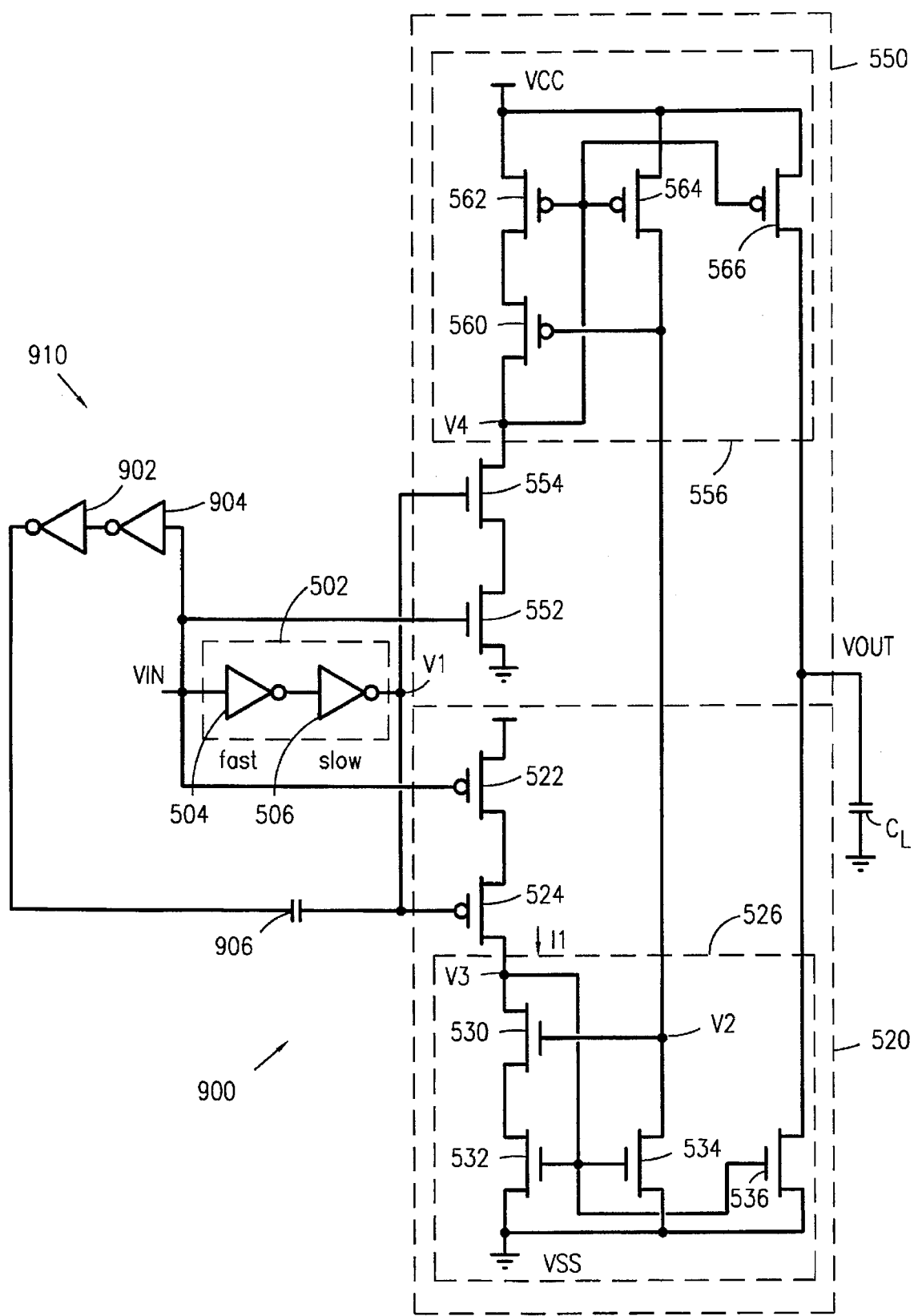
FIG. 9 is a schematic circuit diagram illustrating a controlled-slope CMOS level output buffer including a delay reduction circuit in accordance with an embodiment of the present invention.

Referring to FIG. 9, a schematic circuit diagram of an additional embodiment of a controlled-slope CMOS level output buffer 900 is shown. The controlled-slope CMOS level output buffer 900 is substantially equivalent to the controlled-slope CMOS level output buffer 500 shown in FIG. 5. However, in addition to the circuit elements of CMOS level output buffer 500, the CMOS level output buffer 900 also includes a delay reduction circuit 910 having a first inverter 902, a second inverter 904 and a capacitor 906. The second inverter 904, first inverter 902 and capacitor 906 are connected in series between the input voltage line VIN and the node V1 and operate to reduce the duration of the first time period T1, which is illustrated in the timing diagram of FIG. 7. During the first time period T1, the voltage at node V1 is charging until n-channel drive transistor 524 or n-channel drive transistor 554 begins to conduct current. The voltage at node V1 is precharged by a capacitive coupling formed by capacitor 906. The capacitive coupling of capacitor 906 is designed to precharge the voltage at node V1 at a voltage amplitude which is near the threshold voltage of n-channel drive transistors 524 and 554.

Figure 10:
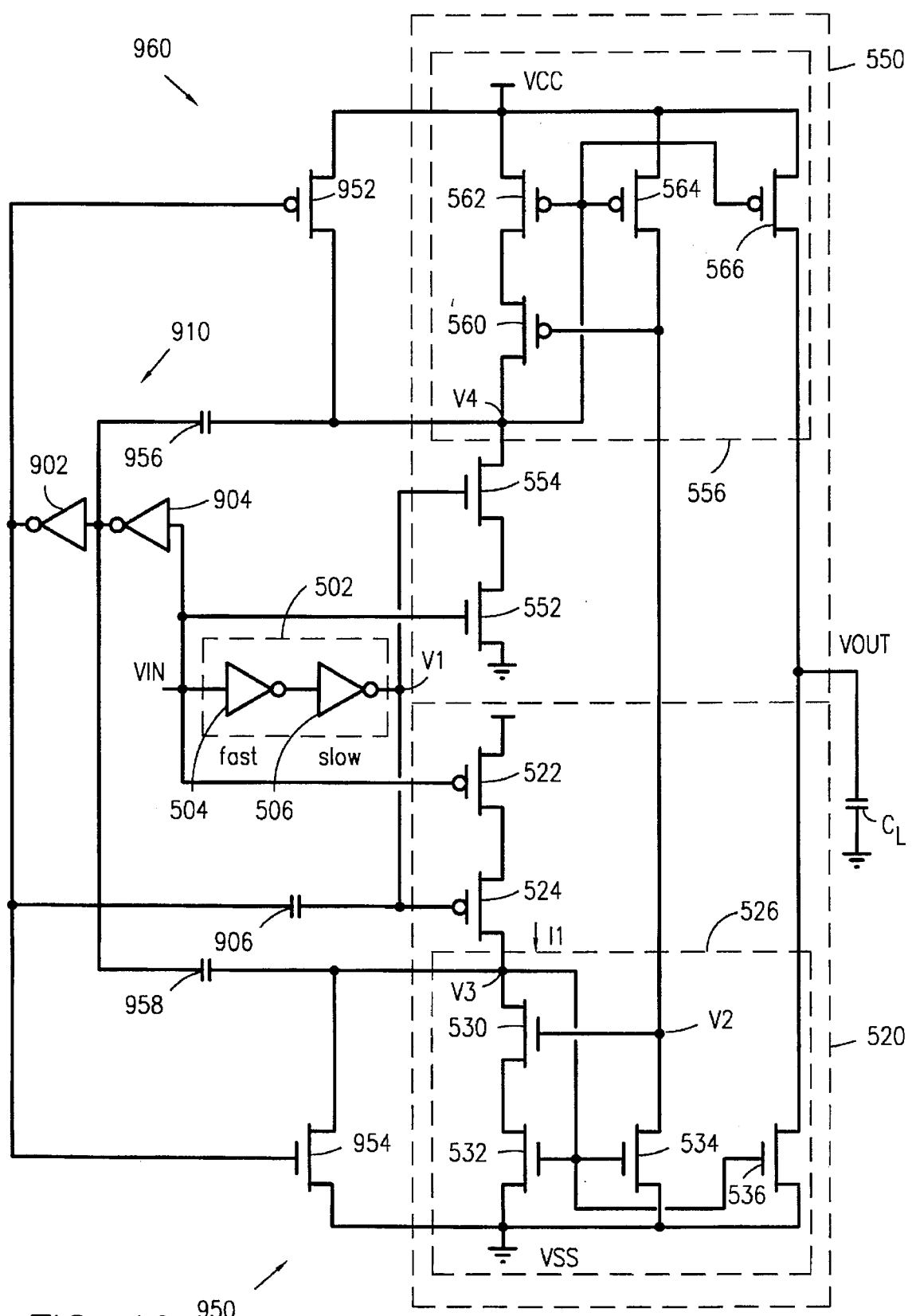
FIG. 10 is a schematic circuit diagram illustrating a controlled-slope CMOS level output buffer including a delay reduction circuit and a feedthrough reduction circuit in accordance with an embodiment of the present invention.

Referring to FIG. 10, a schematic circuit diagram of an additional embodiment of a controlled-slope CMOS level output buffer 950 is shown. The controlled-slope CMOS level output buffer 950 is substantially equivalent to the controlled-slope CMOS level output buffer 900 shown in FIG. 9. However, in addition to the circuit elements of CMOS level output buffer 900, the CMOS level output buffer 950 also contains a feedthrough reduction circuit 960 including a p-channel transistor 952, an n-channel transistor 954, a capacitor 956 and a capacitor 958. The capacitors 956 and 958 are connected in series between node V3 and node V4. The p-channel transistor 952 has a source connected to the supply terminal VCC, a drain connected to the node V4 and a gate connected to an output terminal of inverter 902. The n-channel transistor 954 has a source connected to the reference terminal VSS, a drain connected to the node V3 and a gate connected to an output terminal of inverter 902. These modifications of controlled-slope CMOS level output buffer 950 reduce feedthrough current in the output buffer 950 during switching. Feedthrough current is the current conducting directly from the supply terminal VCC to the reference terminal VSS when the p-channel output transistor 566 and the n-channel output transistor 536 conduct current simultaneously. Feedthrough current increases the current consumption of a circuit and may degrade the groundbounce and EMI performance.

Considering switching of an output signal of the output buffer 950 from a "low" state to a "high" state, the p-channel current mirror 556 begins to conduct current at p-channel output transistor 566 while the n-channel output transistor 536 is still conducting current. The n-channel transistor 954 discharges the voltage at node V3, which is applied to the gate of the n-channel output transistor 536, to a logic zero at the beginning of a switching time period. Accordingly, n-channel output transistor 536 is cut off so that the current through n-channel output transistor 536 is substantially eliminated, effectively terminating the feedthrough current.

Also at the beginning of the switching period, p-channel transistor 952 is cut off, thereby enabling the operation of p-channel current mirror 556. However, in the manner of the operation of CMOS level output buffer 500, the voltage at node V1 continues to charge until the voltage exceeds the voltage at the supply terminal VCC less the threshold gate voltage $VT_p$ of the n-channel drive transistor 554 before the output signal on line VOUT begins to change. Capacitor 956 is included to precharge the voltage at node V4 to approximately the $VCC-V_{TP}$ voltage to reduce switching delay.

For switching of an output signal of the output buffer 950 from a "high" state to a "low" state, p-channel transistor 952 and capacitor 958 function in a manner analogous to the low-to-high transition operation of n-channel transistor 954 and capacitor 956, respectively.

The description of certain embodiments of this invention is intended to be illustrative and not limiting. Numerous other embodiments will be apparent to those skilled in the art, all of which are included within the broad scope of this invention. For example, the delay reduction circuit and the feedthrough reduction circuit are shown incorporated into a CMOS output buffer embodiment. Either or both of the delay reduction circuit and the feedback reduction circuit may also be incorporated into a TTL level output buffer embodiment.

What is claimed is:

1. An output buffer comprising:
    means for sensing an input voltage which is changing from a first logic level to a second logic level;
    an inverter coupled to the sensing means for inverting the sensed input voltage slowly from the second logic level to the first logic level;
    a drive transistor coupled to the inverter and operative during a first period of the slow inverting of the sensed input voltage from the second logic level to the first logic level, for holding a first current in a first current path unchanged until the first period is terminated by the inverted voltage reaching a threshold voltage;
    a delay reduction circuit having an input terminal coupled to the input voltage sensing means and an output terminal coupled to the drive transistor; and
    a current mirror coupled to the drive transistor and operative during a second period of the slow inverting of the sensed input voltage from the second logic level to the first logic level, for conducting the first current and mirroring the first current to a second current in a second current path, the second current discharging a load capacitor holding an output voltage until the second period is terminated by the output voltage reaching a cutoff voltage, the current mirror including:
        a first current mirror transistor;
        a second current mirror transistor, the drive transistor and the first and second current mirror transistors having a source to drain pathway coupled between a supply voltage and a reference voltage;
        a third current mirror transistor having a gate coupled to a gate of the second current mirror transistor and a drain coupled to a gate of the first current mirror transistor; and
        a fourth current mirror transistor having a gate coupled to a drain of the first current mirror transistor and to a gate of the second current mirror transistor; and
    the current mirror being operative during a third period of the slow inverting of the sensed input voltage from the second logic level to the first logic level, for cutting off the first current and conducting a reducing second current.

2. An output buffer according to claim 1 wherein the delay reduction circuit comprises:
    a first inverter having an input terminal coupled to the input voltage sensing means and an output terminal;
    a second inverter having an input terminal coupled to the output terminal of the first inverter and an output terminal; and
    a capacitive-coupling capacitor coupled between the output terminal of the second inverter and the output terminal of the inverter.

3. An output buffer according to claim 1 wherein the first, second, third and fourth current mirror transistors are complementary to the drive transistor.

4. An output buffer according to claim 1 wherein during the first period the drive transistor is in a cutoff condition and the output voltage remains without change.

5. An output buffer according to claim 1 wherein during the first period is terminated when the inverted voltage reaches the threshold voltage so that the drive transistor becomes conductive.

6. An output buffer according to claim 1 wherein:
    the first current in the first current path flows in the source to drain pathway of the drive transistor;
    during the second period, the current flowing in the first current path changes linearly with respect to the change in a voltage generated by the inverter.

7. An output buffer according to claim 1 wherein:
    during the second period, the first current mirror transistor is conductive and the second, third and fourth current mirror transistors operate as a current mirror.

8. An output buffer according to claim 1 wherein:
    third and fourth current mirror transistors are mutually sized so that, during the second period, a source to drain voltage of third current mirror transistor discharges at substantially the same rate as the output voltage.

9. An output buffer according to claim 1 wherein:
    the second period is terminated by the source to drain voltage of the third current mirror transistor is sufficiently low that the first current mirror transistor is cut off.

10. An output buffer according to claim 1 wherein:
    the drive transistor is a first drive transistor, the current mirror is a first current mirror and the first drive transistor and first current mirror form a first output circuit, further comprising:
        a second output circuit including a second drive transistor and a second current mirror,
        the second output circuit, second drive transistor and second current mirror being respectively complementary to the first output circuit, first drive transistor and the first current mirror.

11. An output buffer comprising:
    a slow discharging inverter having an input terminal coupled to a voltage input line and an output terminal;
    an n-channel output circuit including:
        a p-channel drive transistor having a gate terminal coupled to the slow discharging inverter output terminal, a source terminal coupled to a voltage supply and a drain terminal; and
        an n-channel current mirror having a drain terminal coupled to the p-channel drive transistor drain terminal, a voltage source coupled to a voltage reference and an output terminal coupled to a load, the n-channel current mirror further including:
            an n-channel current mirror first n-channel transistor having a drain terminal coupled to the p-channel drive transistor drain terminal, a gate terminal and a source terminal;

an n-channel current mirror second n-channel transistor coupled in series with the n-channel current mirror first n-channel transistor and having a drain terminal coupled to the n-channel current mirror first n-channel transistor source terminal, a gate terminal coupled to the drain terminal of the n-channel current mirror first n-channel transistor and a source terminal coupled to the voltage reference;

an n-channel current mirror third n-channel transistor having a gate terminal coupled to the n-channel current mirror second n-channel transistor gate terminal, a drain terminal coupled to the n-channel current mirror first n-channel transistor gate terminal, and a source terminal coupled to the voltage reference; and an n-channel current mirror fourth n-channel transistor having a gate terminal coupled to the n-channel current mirror first n-channel transistor drain terminal, a drain terminal coupled to the n-channel current mirror output terminal coupled to the load, and a source terminal coupled to the voltage reference; and a p-channel output circuit including:

an n-channel drive transistor having a gate terminal coupled to the slow discharging inverter output terminal, a source terminal coupled to the voltage reference and a drain terminal; and a p-channel current mirror having a drain terminal coupled to the n-channel drive transistor drain terminal, a source terminal coupled to the voltage supply and an output terminal coupled to the load, the p-channel current mirror further comprising:

a p-channel current mirror first p-channel transistor having a drain terminal coupled to the n-channel drive transistor drain terminal, a gate terminal and a source terminal;

a p-channel current mirror second p-channel transistor coupled in series with the p-channel current mirror first p-channel transistor and having a drain terminal coupled to the p-channel current mirror first p-channel transistor source terminal, a gate terminal coupled to the drain terminal of the p-channel current mirror first p-channel transistor and a source terminal coupled to the voltage supply;

a p-channel current mirror third p-channel transistor having a gate terminal coupled to the p-channel current mirror second p-channel transistor gate terminal, a drain terminal coupled to the p-channel current mirror first p-channel transistor gate terminal and coupled to the n-channel current mirror third n-channel transistor drain terminal, and a source terminal coupled to the voltage supply; and a p-channel current mirror fourth p-channel transistor having a gate terminal coupled to the p-channel current mirror first p-channel transistor drain terminal, a drain terminal coupled to the p-channel current mirror output terminal coupled to the load, and a source terminal coupled to the voltage supply;

the slow discharging inverter having a response slower than the response of the transistors in the n-channel output circuit and the p-channel output circuit.

12. An output buffer according to claim 11 further comprising:

a fast discharging inverter coupled between the voltage input line and the slow discharging inverter, having an input terminal coupled to the voltage input line and an output terminal coupled to the input terminal of the slow discharging inverter, the fast discharging inverter having a response faster than the slow discharging inverter.

13. An output buffer according to claim 12 wherein the p-channel drive transistor in the n-channel output circuit is a first p-channel drive transistor, further comprising:

a second p-channel drive transistor in the n-channel output circuit, the second p-channel drive transistor being coupled in series between the voltage supply and the first p-channel drive transistor and having a gate terminal coupled to the voltage input line, a source terminal coupled to a voltage supply and a drain terminal coupled to the source terminal of the first p-channel drive transistor.

14. An output buffer according to claim 12 wherein the n-channel drive transistor in the p-channel output circuit is a first n-channel drive transistor, further comprising:

a second n-channel drive transistor in the p-channel output circuit, the second n-channel drive transistor being coupled in series between the voltage reference and the first n-channel drive transistor and having a gate terminal coupled to the voltage input line, a source terminal coupled to a voltage reference and a drain terminal coupled to the source terminal of the first n-channel drive transistor.

15. An output buffer according to claim 11 wherein the p-channel current mirror further comprises:

a p-channel current mirror first p-channel transistor having a drain terminal coupled to the n-channel drive transistor drain terminal, a gate terminal and a source terminal;

a p-channel current mirror second p-channel transistor coupled in series with the p-channel current mirror first p-channel transistor and having a drain terminal coupled to the p-channel current mirror first p-channel transistor source terminal, a gate terminal coupled to the drain terminal of the p-channel current mirror first p-channel transistor and a source terminal coupled to the voltage supply;

a p-channel current mirror third p-channel transistor having a gate terminal coupled to the p-channel current mirror second p-channel transistor gate terminal, a drain terminal coupled to the p-channel current mirror first p-channel transistor gate terminal, and a source terminal coupled to the voltage supply;

a p-channel current mirror first n-channel transistor having a gate terminal coupled to the p-channel current mirror first p-channel transistor gate terminal, a drain terminal coupled to the p-channel current mirror third p-channel transistor drain terminal, and a source terminal coupled to the n-channel current mirror third n-channel transistor drain terminal; and a p-channel current mirror second n-channel transistor having a gate terminal coupled to the p-channel current mirror first p-channel transistor gate terminal, a source terminal coupled to the p-channel current mirror output terminal coupled to the load, and a drain terminal coupled to the voltage supply.

16. An output buffer comprising:

a slow discharging inverter having an input terminal coupled to a voltage input line and an output terminal;

an n-channel output circuit including:

a p-channel drive transistor having a gate terminal coupled to the slow discharging inverter output terminal, a source terminal coupled to a voltage supply and a drain terminal; and an n-channel current mirror having a drain terminal coupled to the p-channel drive transistor drain terminal, a voltage source coupled to a voltage reference and an output terminal coupled to a load, the n-channel current mirror further including:

an n-channel current mirror first n-channel transistor having a drain terminal coupled to the p-channel drive transistor drain terminal, a gate terminal and a source terminal;

an n-channel current mirror second n-channel transistor coupled in series with the n-channel current mirror first n-channel transistor and having a drain terminal coupled to the n-channel current mirror first n-channel transistor source terminal, a gate terminal coupled to the drain terminal of the n-channel current mirror first n-channel transistor and a source terminal coupled to the voltage reference;

an n-channel current mirror third n-channel transistor having a gate terminal coupled to the n-channel current mirror second n-channel transistor gate terminal, a drain terminal coupled to the n-channel current mirror first n-channel transistor gate terminal, and a source terminal coupled to the voltage reference; and an n-channel current mirror fourth n-channel transistor having a gate terminal coupled to the n-channel current mirror first n-channel transistor drain terminal, a drain terminal coupled to the n-channel current mirror output terminal coupled to the load, and a source terminal coupled to the voltage reference; and a p-channel output circuit including:

an n-channel drive transistor having a gate terminal coupled to the slow discharging inverter output terminal, a source terminal coupled to the voltage reference and a drain terminal; and a p-channel current mirror having a drain terminal coupled to the n-channel drive transistor drain terminal, a source terminal coupled to the voltage supply and an output terminal coupled to the load, the p-channel current mirror further comprising:

a p-channel current mirror first p-channel transistor having a drain terminal coupled to the n-channel drive transistor drain terminal, a gate terminal and a source terminal;

a p-channel current mirror second p-channel transistor coupled in series with the p-channel current mirror first p-channel transistor and having a drain terminal coupled to the p-channel current mirror first p-channel transistor source terminal, a gate terminal coupled to the drain terminal of the p-channel current mirror first p-channel transistor and a source terminal coupled to the voltage supply;

a p-channel current mirror third p-channel transistor having a gate terminal coupled to the p-channel current mirror second p-channel transistor gate terminal, a drain terminal coupled to the p-channel current mirror first p-channel transistor gate terminal and coupled to the n-channel current mirror third n-channel transistor drain terminal, and a source terminal coupled to the voltage supply; and a p-channel current mirror fourth p-channel transistor having a gate terminal coupled to the p-channel current mirror first p-channel transistor drain terminal, a drain terminal coupled to the p-channel current mirror output terminal coupled to the load, and a source terminal coupled to the voltage supply; and a delay reduction circuit having an input terminal coupled to the voltage input line and an output terminal coupled to the n-channel output circuit and the p-channel output circuit.

17. An output buffer according to claim 16 wherein the delay reduction circuit comprises:

a first inverter having an input terminal coupled to the voltage input line and an output terminal;

a second inverter having an input terminal coupled to the output terminal of the first inverter and an output terminal; and a capacitive-coupling capacitor coupled between the output terminal of the second inverter and the output terminal of the slow discharging inverter.

18. An output buffer comprising:

a slow discharging inverter having an input terminal coupled to a voltage input line and an output terminal;

an n-channel output circuit including:

a p-channel drive transistor having a gate terminal coupled to the slow discharging inverter output terminal, a source terminal coupled to a voltage supply and a drain terminal; and an n-channel current mirror having a drain terminal coupled to the p-channel drive transistor drain terminal, a voltage source coupled to a voltage reference and an output terminal coupled to a load, the n-channel current mirror further including:

an n-channel current mirror first n-channel transistor having a drain terminal coupled to the p-channel drive transistor drain terminal, a gate terminal and a source terminal;

an n-channel current mirror second n-channel transistor coupled in series with the n-channel current mirror first n-channel transistor and having a drain terminal coupled to the n-channel current mirror first n-channel transistor source terminal, a gate terminal coupled to the drain terminal of the n-channel current mirror first n-channel transistor and a source terminal coupled to the voltage reference;

an n-channel current mirror third n-channel transistor having a gate terminal coupled to the n-channel current mirror second n-channel transistor gate terminal, a drain terminal coupled to the n-channel current mirror first n-channel transistor gate terminal, and a source terminal coupled to the voltage reference; and an n-channel current mirror fourth n-channel transistor having a gate terminal coupled to the n-channel current mirror first n-channel transistor drain terminal, a drain terminal coupled to the n-channel current mirror output terminal coupled to the load, and a source terminal coupled to the voltage reference; and a p-channel output circuit including:

an n-channel drive transistor having a gate terminal coupled to the slow discharging inverter output terminal, a source terminal coupled to the voltage reference and a drain terminal; and a p-channel current mirror having a drain terminal coupled to the n-channel drive transistor drain terminal, a source terminal coupled to the voltage supply and an output terminal coupled to the load, the p-channel current mirror further comprising:

a p-channel current mirror first p-channel transistor having a drain terminal coupled to the n-channel drive transistor drain terminal, a gate terminal and a source terminal;

a p-channel current mirror second p-channel transistor coupled in series with the p-channel current mirror first p-channel transistor and having a drain terminal coupled to the p-channel current mirror first p-channel transistor source terminal, a gate terminal coupled to the drain terminal of the p-channel current mirror first p-channel transistor and a source terminal coupled to the voltage supply;

a p-channel current mirror third p-channel transistor having a gate terminal coupled to the p-channel current mirror second p-channel transistor gate terminal, a drain terminal coupled to the p-channel current mirror first p-channel transistor gate terminal and coupled to the n-channel current mirror third n-channel transistor drain terminal, and a source terminal coupled to the voltage supply; and a p-channel current mirror fourth p-channel transistor having a gate terminal coupled to the p-channel current mirror first p-channel transistor drain terminal, a drain terminal coupled to the p-channel current mirror output terminal coupled to the load, and a source terminal coupled to the voltage supply; and a feedthrough reduction circuit coupled between the n-channel output circuit and the p-channel output circuit.

19. An output buffer according to claim 18 wherein the feedthrough reduction circuit comprises:

a feedthrough reduction circuit p-channel transistor having a source terminal coupled to the voltage supply, a drain terminal coupled to the drain terminal of the n-channel drive transistor and a gate terminal;

a feedthrough reduction circuit n-channel transistor having a source terminal coupled to the voltage reference, a drain terminal coupled to the drain terminal of the p-channel drive transistor and a gate terminal coupled to the gate terminal of the feedthrough reduction circuit p-channel transistor; and feedthrough reduction circuit first and second capacitors coupled in series between the drain of the feedthrough reduction circuit p-channel transistor and the drain of the feedthrough reduction circuit n-channel transistor.

20. An output buffer according to claim 18 further comprising:

a delay reduction circuit having an input terminal coupled to the voltage input line and an output terminal coupled to the n-channel output circuit and the p-channel output circuit.

21. An output buffer according to claim 20 wherein the delay reduction circuit comprises:

a first inverter having an input terminal coupled to the voltage input line and an output terminal coupled at a node between the feedthrough reduction circuit first and second capacitors;

a second inverter having an input terminal coupled to the output terminal of the first inverter and an output terminal coupled at a node between the gates of the feedthrough reduction circuit p-channel and n-channel transistors; and a capacitive-coupling capacitor coupled between the output terminal of the second inverter and the output terminal of the slow discharging inverter.

* * * * *